(12) United States Patent
Tsuchiya

(10) Patent No.: US 6,184,120 B1
(45) Date of Patent: Feb. 6, 2001

(54) METHOD OF FORMING A BURIED PLUG AND AN INTERCONNECTION

(75) Inventor: Yasuaki Tsuchiya, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 08/980,287

(22) Filed: Nov. 28, 1997

(30) Foreign Application Priority Data

Dec. 6, 1996 (JP) .................................................. 8-326932

(51) Int. Cl.⁷ .............................................. H01L 21/4763
(52) U.S. Cl. .......................... 438/618; 438/627; 438/648; 438/584
(58) Field of Search .................... 438/618, 627, 438/648, 649

(56) References Cited

U.S. PATENT DOCUMENTS

| | | | |
|---|---|---|---|
| 4,960,732 | * 10/1990 | Dixit et al. | 438/628 |
| 5,166,093 | * 11/1992 | Grief | 437/173 |
| 5,244,534 | 9/1993 | Yu et al. | 156/636 |
| 5,356,836 | * 10/1994 | Chen et al. | 438/627 |
| 5,527,423 | * 6/1996 | Neville et al. | 438/693 |
| 5,554,565 | * 9/1996 | Liaw et al. | 438/233 |
| 5,686,355 | * 11/1997 | Sumi et al. | 438/654 |
| 5,700,716 | * 12/1997 | Sharan et al. | 438/630 |
| 5,714,038 | * 2/1998 | Kim | 156/644.1 |
| 5,759,905 | * 6/1998 | Pan et al. | 438/565 |
| 5,801,098 | * 9/1998 | Fiordalice et al. | 438/653 |
| 5,837,608 | * 11/1998 | Choi | 438/675 |
| 5,847,463 | * 12/1998 | Trivedi et al. | 257/751 |
| 5,893,749 | * 4/1999 | Matumoto et al. | 438/627 |
| 5,911,113 | * 6/1999 | Yao et al. | 438/649 |

FOREIGN PATENT DOCUMENTS

| | | |
|---|---|---|
| 2-98935 | 4/1990 | (JP) . |
| 5-275366 | 10/1993 | (JP) . |
| 6-349826 | 12/1994 | (JP) . |
| 5-17918 | 1/1996 | (JP) . |
| 8-288391 | 11/1996 | (JP) . |
| 17453 | 6/1998 | (JP) . |

OTHER PUBLICATIONS

Wolf, S; Silicon Processing for the VLSI Era vol. 2: Process Integration, 1990 pp. 189–194).olf (Silicon Processing for the VLSI Era vol. 2: Process Integration, 1990 pp. 189–194).*

Wolf, S.; Silicon Processing for the VLSI Era vol. 2: Process Integration, Sunset Beach, CA, p.p., Jan. 1990.*

* cited by examiner

Primary Examiner—Jey Tsai
Assistant Examiner—Christopher Lattin
(74) Attorney, Agent, or Firm—Young & Thompson

(57) ABSTRACT

In a method of forming a buried plug and an interconnection over the same, a conductive film is deposited not only over a top surface of an insulation film extending over a semiconductor substrate but also within a contact hole formed in the insulation film so that the conductive film over the top surface of the insulation film has a thickness which is thicker than a predetermined thickness, and a top surface of the conductive film is planarized so that the conductive film over the insulation film has the predetermined thickness whereby an interconnection layer is unitarily formed with a conductive plug conductive film buried within the contact hole.

10 Claims, 10 Drawing Sheets

1 : semiconductor substrate

2 : insulation film

3 : contact hole

5 : titanium nitride base layer

6A : copper interconnection

1 : semiconductor substrate

2A : insulation film

3 : contact hole

7 : tungsten film

1 : semiconductor substrate

2A : insulation film

3 : contact hole

7A : tungsten plug

8 : recess

1 : semiconductor substrate

2A : insulation film

3 : contact hole

7A : tungsten plug

1 : semiconductor substrate

2A : insulation film

3 : contact hole

7A : tungsten plug

9 : interconnection layer

1 : semiconductor substrate

2 : insulation film

3 : contact hole

1 : semiconductor substrate

2 : insulation film

3 : contact hole

6 : copper film

1 : semiconductor substrate

2 : insulation film

3 : contact hole

6A : copper interconnection

1 : semiconductor substrate

2 : insulation film

3 : contact hole

5 : titanium nitride base layer

1 : semiconductor substrate

2 : insulation film

3 : contact hole

5 : titanium nitride base layer

6 : copper film

1 : semiconductor substrate

2 : insulation film

3 : contact hole

5 : titanium nitride base layer

6A : copper interconnection

METHOD OF FORMING A BURIED PLUG AND AN INTERCONNECTION

BACKGROUND OF THE INVENTION

Description of the Related Art

The present invention relates to a method of forming a semiconductor device, and more particularly to a method of forming a metal plug buried in an insulation layer over a semiconductor substrate and an interconnection extending over the insulation layer so as to be connected to the metal plug.

One of the conventional methods for forming the buried metal plug and the interconnection is disclosed in Japanese laid-open patent publication No. 5-275366. A conductive plug is buried in the insulation film before a top portion of the conductive plug and a top surface of the insulation film are planerized for subsequent formation of an interconnection layer extending over the planarized surface of the insulation film.

The above method will be described in detail with reference to FIGS. 1A through 1D. With reference to FIG. 1A, an insulation film 2A is formed on a top surface of a semiconductor substrate 1. A contact hole 3 is formed in the insulation film 2A. A tungsten film 7 is deposited by a chemical vapor deposition over the insulation film 2A and within the contact hole 3 so that the tungsten film 7 within the contact hole 3 is in contact with the semiconductor substrate 1. With reference to FIG. 1B, a first chemical mechanical polishing method is made wherein a polishing rate of the tungsten film 7 is much higher than a polishing rate of the insulation film 2A so that the tungsten film 7 over the insulation film 2A is removed and a surface region of the insulation film 2A is also removed as well as the tungsten film 7 within the top portion of the contact hole 3 is further removed. As a result, an overpolishing of the tungsten film 7 within the top portion of the contact hole 3 appears to form a recess 8 at the top portion of the contact hole 3. The top portion of the remaining tungsten plug 7A within the contact hole 3 is leveled slightly lower than the top surface of the insulation film 2A.

With reference to FIG. 1C, a second chemical and mechanical polishing is made wherein a polishing rate of the tungsten film 7 is much lower than a polishing rate of the insulation film 2A so that mainly the surface region of the insulation film 2A is polished whereby the top surface of the insulation film 2A is leveled to the top portion of the tungsten plug 7A.

With reference to FIG. 1D, an interconnection layer 9 is entirely deposited on a leveled or planarized surface of the insulation film 2A with the tungsten plug 7A. The interconnection layer 9 is then patterned to form an interconnection which is in contact with the top portion of the tungsten plug.

The above conventional method has the following three problems.

First, in order to level the top portion of the tungsten plug to the insulation film 2A, two chemical and mechanical polishing processes are required as described above. This makes the fabrication process complicated.

Second, the tungsten plug and the interconnection layer are formed by two deposition processes and two chemical and mechanical polishing processes in separate processes as described above. This makes the fabrication process complicated.

Third, the increase in resistance of the connection portion between the tungsten plug and the interconnection or any disconnection between the tungsten plug and the interconnection may be caused because the tungsten plug and the interconnection layer are deposited in separate processes as described above.

In the above circumstances, it had been required to develop a novel method of forming a buried plug and an interconnection over the same free from the above three problems.

SUMMARY OF THE INVENTION

Accordingly, it is an object of the present invention to provide a novel method of forming a buried plug and an interconnection over the same free from the above three problems.

It is a further object of the present invention to provide a novel method of forming a buried plug and an interconnection over the same free from any increase in resistance of a connection portion between the tungsten plug and the interconnection.

It is a still further object of the present invention to provide a novel method of forming a buried plug and an interconnection over the same free from any disconnection between the tungsten plug and the interconnection.

It is yet a further object of the present invention to provide a novel method of forming a buried plug and an interconnection over the same which allows reduced umber of the fabrication processes.

The above and other objects, features and advantages of the present invention will be apparent from the following descriptions.

The present invention provides a method of forming a buried plug and an interconnection over the same. A conductive film is deposited not only over a top surface of an insulation film extending over a semiconductor substrate but also within a contact hole formed in the insulation film so that the conductive film over the top surface of the insulation film has a thickness which is thicker than a predetermined thickness. A top surface of the conductive film is planarized so that the conductive film over the insulation film has the predetermined thickness whereby an interconnection layer is unitary formed with a conductive plug conductive film buried within the contact hole.

BRIEF DESCRIPTION OF THE DRAWINGS

Preferred embodiments according to the present invention will be described in detail with reference to the accompanying drawings.

DISCLOSURE OF THE INVENTION

Figure 1A:
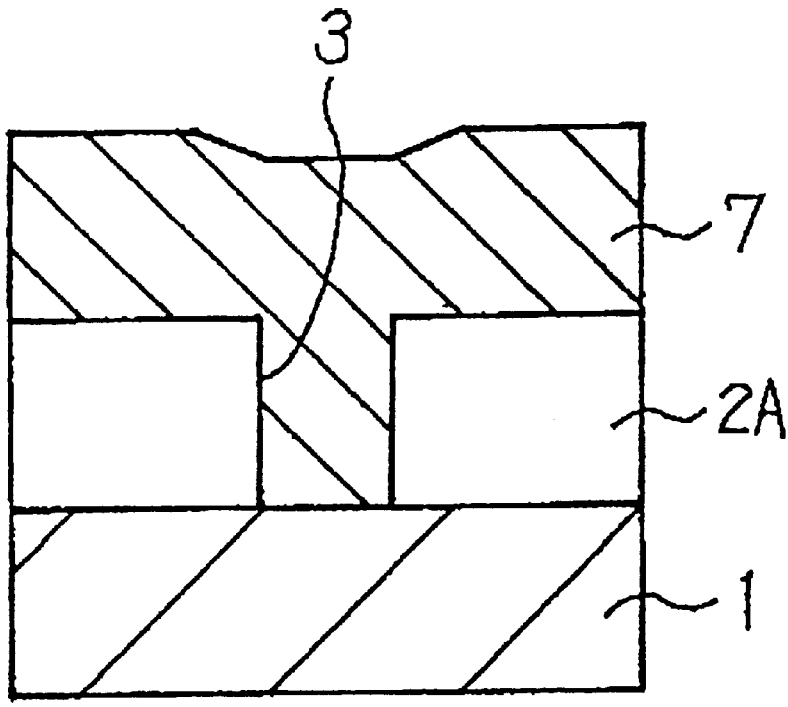
FIGS. 1A through 1D are fragmentary cross sectional elevation views illustrative of semiconductor devices in sequential steps involved in the conventional method of forming the buried plug and the interconnection separately formed over the buried plug.
Figure 1B:
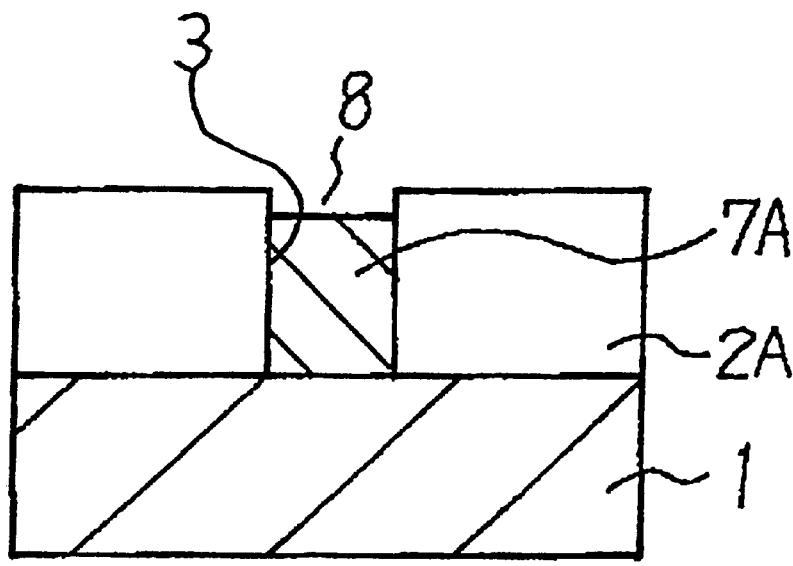
Figure 1C:
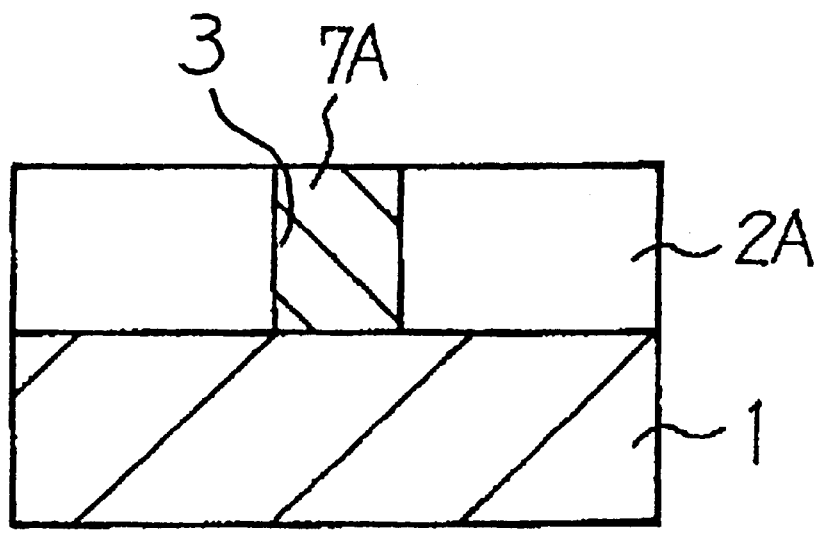
Figure 1D:
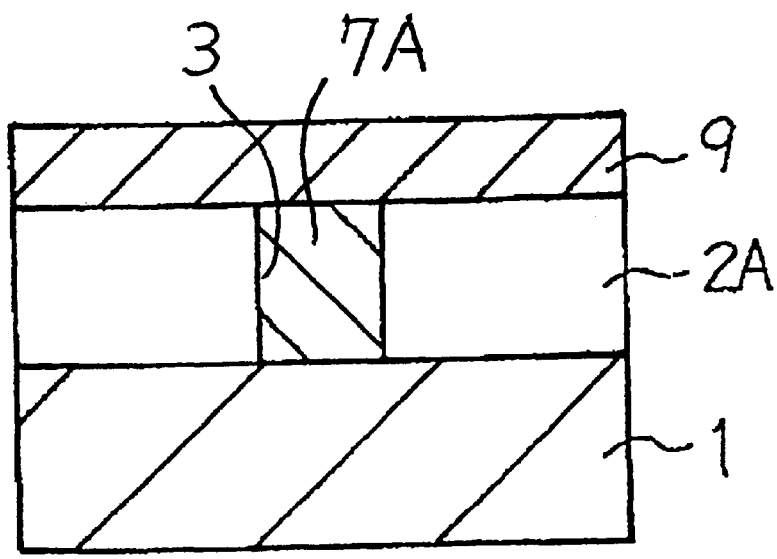

The first present invention provides a method of forming a buried plug and an interconnection over the same. A conductive film is deposited not only over a top surface of an insulation film extending over a semiconductor substrate but also within a contact hole formed in the insulation film so that the conductive film over the top surface of the insulation film has a thickness which is thicker than a predetermined thickness. A top surface of the conductive film is planarized so that the conductive film over the insulation film have the predetermined thickness whereby an interconnection layer is unitary formed with a conductive plug conductive film buried within the contact hole. Further, the conductive film over the insulation film is patterned to form at least an interconnection over the insulation film so that the interconnection is united with the conductive plug. Optionally, a base layer may be formed over a top surface of the insulation film and vertical walls of the contact hole as well as over a part of the top surface of the semiconductor substrate before depositing the conductive film on the base layer.

The base layer may be made of one selected from the group consisting of TiN, TiW, TiWN and Ta.

The conductive film may comprise a copper film deposited by a chemical vapor deposition method.

The conductive film may comprise an aluminum film deposited by a chemical vapor deposition method.

The conductive film may comprise a tungsten film deposited by a chemical vapor deposition method.

The conductive film may comprise a copper film deposited by a sputtering method.

The conductive film may comprise an aluminum film deposited by a sputtering method.

The conductive film may comprise a tungsten film deposited by a sputtering method.

The planerizing may be carried out by a chemical and mechanical polishing method.

The chemical and mechanical polishing method may be carried out using a slurry containing an oxidizing agent and alumina as abrasive powders.

The chemical and mechanical polishing method may be carried out using a slurry containing an oxidizing agent and silica as abrasive powders.

The first present invention provides a method of forming a semiconductor device. An insulation film is formed over a semiconductor substrate. A photo-resist pattern is provided over the insulation film. An anisotropic etching is carried out to form a contact hole in the insulation film so that a part of the semiconductor substrate is shown through the contact hole. A conductive film is deposited not only over a top surface of the insulation film but also within the contact hole so that the conductive film over the top surface of the insulation film has a thickness which is thicker than a predetermined thickness. A top surface of the conductive film is subjected to a chemical and mechanical polishing to planarize the top surface of the conductive film so that the conductive film over the insulation film has the predetermined thickness whereby an interconnection layer is unitary formed with a conductive plug of the conductive film buried within the contact hole. The conductive film over the insulation film is patterned to form at least an interconnection over the insulation film so that the interconnection is united with the conductive plug.

The first present invention provides a method of forming a semiconductor device. An insulation film is formed over a semiconductor substrate. A photo-resist pattern is provided over the insulation film for carrying out an anisotropic etching to form a contact hole in the insulation film so that a part of the semiconductor substrate is shown through the contact hole. A base layer is formed not only over a top surface of the insulation film but also on vertical side walls of the contact hole as well as on the shown part of the semiconductor substrate. A conductive film is deposited over the base layer so that the conductive film extends not only over the base layer extending over the insulation film but also within the contact hole, wherein the conductive film over the top surface of the insulation film has a thickness which is thicker than a predetermined thickness. A top surface of the conductive film is subjected to a chemical and mechanical polishing to planarize the top surface of the conductive film so that the conductive film over the insulation film has the predetermined thickness whereby an interconnection layer is unitary formed with a conductive plug of the conductive film buried within the contact hole. The conductive film over the insulation film is patterned to form at least an interconnection over the insulation film so that the interconnection is united with the conductive plug.

PREFERRED EMBODIMENTS

First Embodiment

Figure 2A:
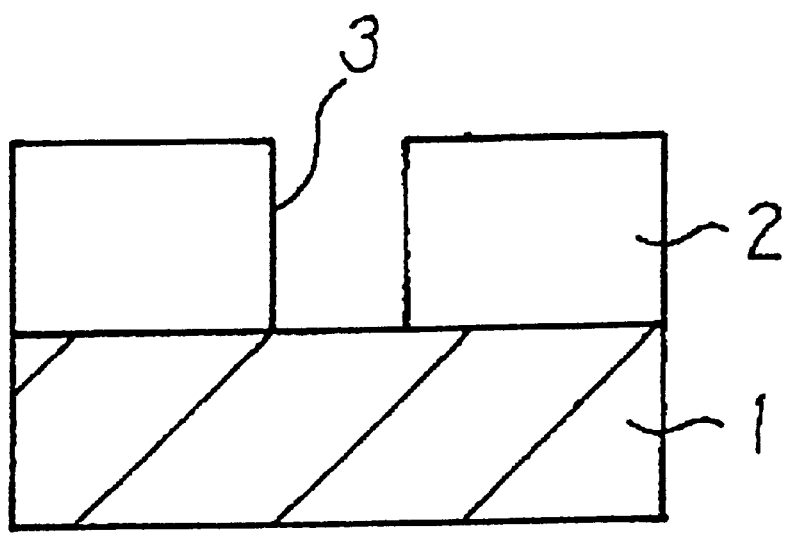
FIGS. 2A through 2C are fragmentary cross sectional elevation views illustrative of semiconductor devices in sequential steps involved in a novel method of forming the buried plug and the interconnection separately formed over the buried plug in a first embodiment according to the present invention.
Figure 2B:
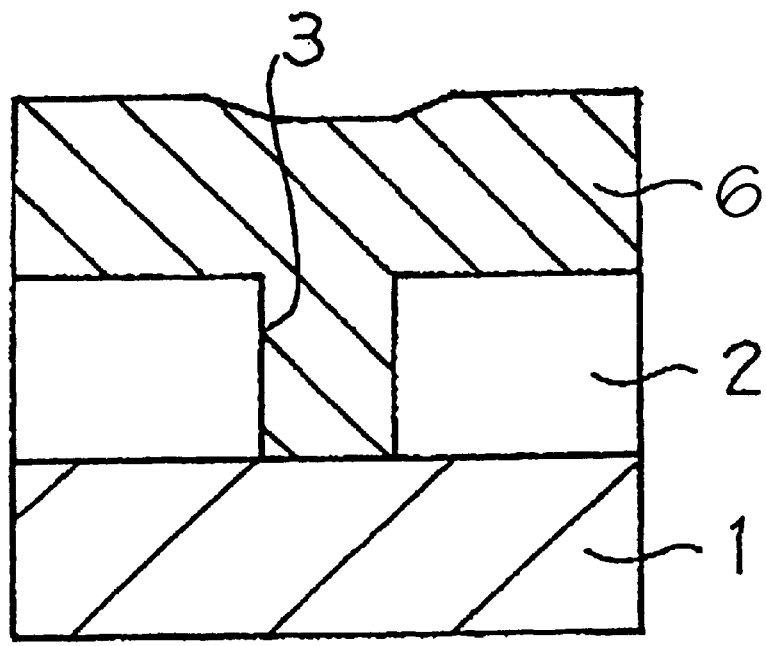
Figure 2C:
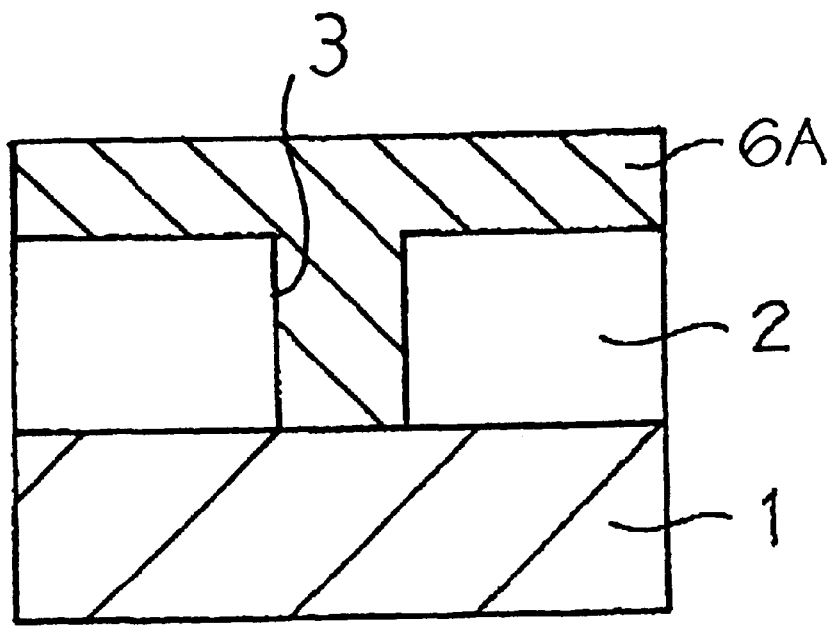

A first embodiment according to the present invention will be described in detail with reference to FIGS. 2A through 2C illustrative of semiconductor devices in sequential steps involved in a novel method of forming the buried plug and the interconnection separately formed over the buried plug in a first embodiment according to the present invention.

With reference to FIG. 2A, an insulation film 2 made of $SiO_2$ and having a thickness of about 100 nanometers is deposited on a semiconductor substrate 1 of silicon by a chemical vapor deposition. A photo-resist pattern is provided on the insulation film 2 for subsequent anisotropic etching to the insulation film 2 to form a contact hole 3 in the insulation film 2. In place of the $SiO_2$ insulation film 2, an SiOF film may be formed using $SiF_4+SiH_4+O_2$ source gas. Further, alternatively, a benzocyclobutene film may be formed by a spin coating method. A polyimide film may also be formed by a spin coating method. In addition, any other organic film may be formed in place of the $SiO_2$ insulation film 2.

With reference to FIG. 2B, an copper film 6 as a conductive film is deposited by a chemical vapor deposition method using $(CH_3)_2AlH$ source gas at a temperature of 150° C. for 10 minutes. The copper film 6 is deposited not only to form a buried plug portion buried within the contact hole 3 but also to form an interconnection layer portion over the insulation film 2, wherein the interconnection layer portion over the insulation film 2 has a thickness of about 1000 nanometers which is thicker than a predetermined interconnection layer thickness of 500 nanometers. It is possible as a modification to use other conductive materials and other deposition methods.

With reference to FIG. 2C, a chemical and mechanical polishing method is carried out using a slurry including oxidizing agent and either alumina or silica as abrasive powders at a polishing rate of 200 nanometers/minute for 2.5 minutes, in order to polish the top surface of the copper film 6. The polishing accuracy is ±10%. The thickness of the interconnection layer portion of the copper film 6 over the insulation film 2 is reduced to the predetermined interconnection layer thickness of 500 nanometers whereby the polished top surface of the interconnection layer portion of the copper film 6 is planerized. The interconnection layer portion of the copper film 6 is then patterned to form an interconnection 4A.

In accordance with the above first embodiment, the interconnection layer and the contact plug are concurrently and unitary formed in a single deposition process and subsequent single chemical and mechanical polishing process. The number of the processes for fabrication is reduced. Since the interconnection layer and the contact plug are unitary formed, there is no problem with increase in the resistance at the connection portion between the interconnection and the buried plug nor problem with the disconnection between the interconnection and the buried plug.

Second Embodiment

Figure 3A:
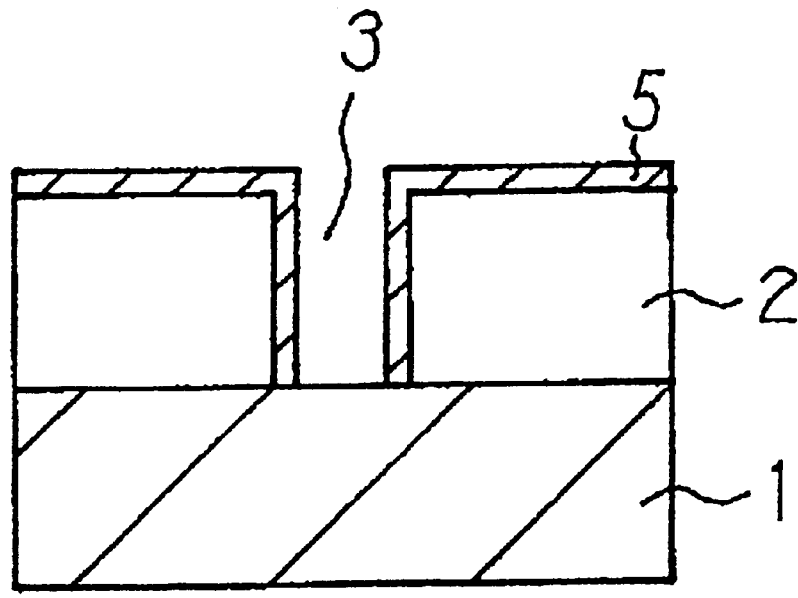
FIGS. 3A through 3C are fragmentary cross sectional elevation views illustrative of semiconductor devices in sequential steps involved in a novel method of forming the buried plug and the interconnection separately formed over the buried plug in a second embodiment according to the present invention.
Figure 3B:
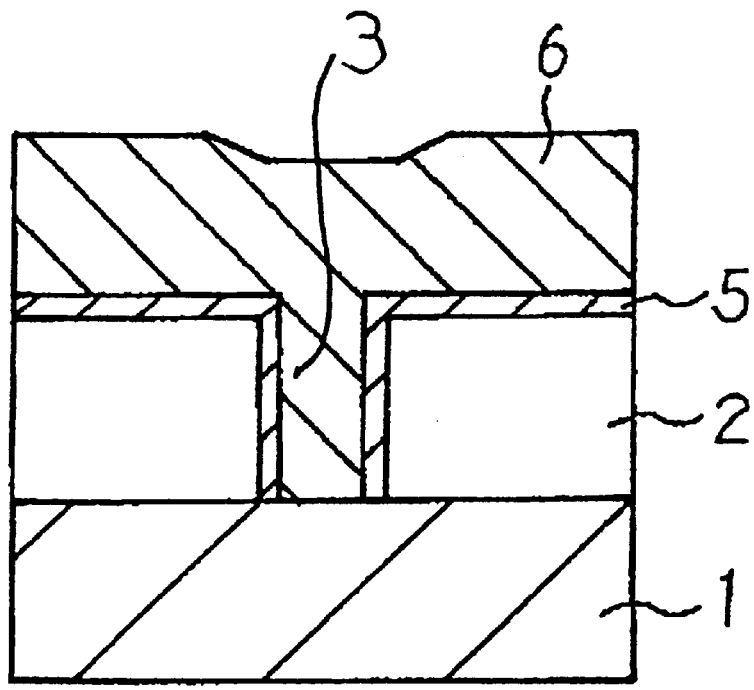
Figure 3C:
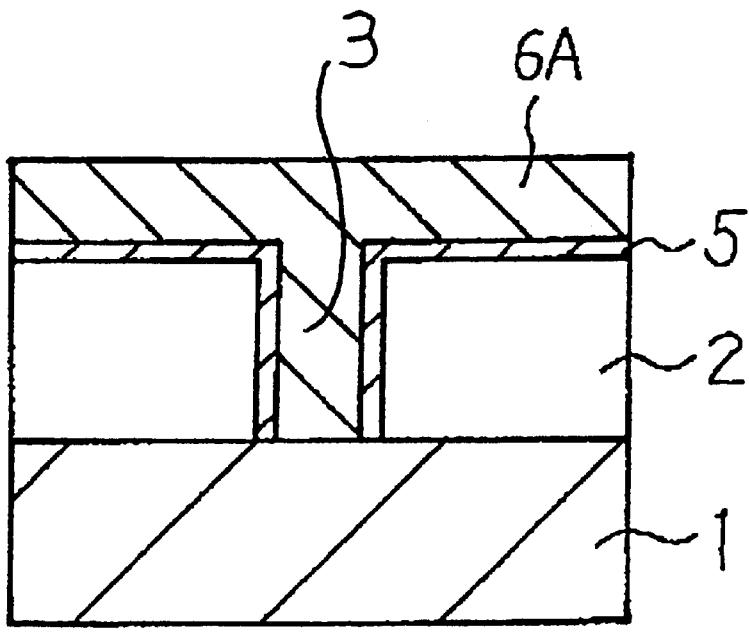

A second embodiment according to the present invention will be described in detail with reference to FIGS. 3A through 3C illustrative of semiconductor devices in sequential steps involved in a novel method of forming the buried plug and the interconnection separately formed over the buried plug in a second embodiment according to the present invention.

With reference to FIG. 3A, an insulation film 2 made of $SiO_2$ and having a thickness of about 100 nanometers is deposited on a semiconductor substrate 1 of silicon by a chemical vapor deposition. A photo-resist pattern is provided on the insulation film 2 for subsequent anisotropic etching to the insulation film 2 to form a contact hole 3 in the insulation film 2. In place of the $SiO_2$ insulation film 2, an SiOF film may be formed using $SiF_4+SiH_4+O_2$ source gas. Further, alternatively, a benzocyclobutene film may also be formed by a spin coating method. A polyimide film may also be formed by a spin coating method. In addition, any other organic film may be formed in place of the $SiO_2$ insulation film 2. Subsequently, a base layer 5 of TiN having a thickness of 50 nanometers is deposited over the insulation film 2 and on the vertical walls of the contact hole 3. The base layer 5 serves as a diffusion barrier layer against the following conductive film. The base layer 5 also serves as a adhesive layer with the following conductive film. The base layer 5 also serves as a seed layer. In place of TiN, other materials such as TiW, TiWN and Ta are available for the base layer 5.

With reference to FIG. 3B, a copper film 6 as a conductive film is deposited by a chemical vapor deposition method using (copper hexaphloroacetylacetonate-trimethylvinylsilane source gas at a temperature of 170° C. for 20 minutes. The copper film 6 is deposited not only to form a buried plug portion buried within the contact hole 3 but also to form an interconnection layer portion over the insulation film 2, wherein the interconnection layer portion over the insulation film 2 has a thickness of about 1000 nanometers which is thicker than a predetermined interconnection layer thickness of 500 nanometers. It is possible as a modification to use other conductive materials and other deposition methods.

With reference to FIG. 3C, a chemical and mechanical polishing method is carried out using a slurry including oxidizing agent and either alumina or silica as abrasive powders at a polishing rate of 400 nanometers/minute for 1.25 minutes, in order to polish the top surface of the copper film 6. The polishing accuracy is ±10%. The thickness of the interconnection layer portion of the copper film 6 over the insulation film 2 is reduced to the predetermined interconnection layer thickness of 500 nanometers whereby the polished top surface of the interconnection layer portion of the copper film 6 is planerized. The interconnection layer portion of the copper film 6 is then patterned to form an interconnection 6A.

In accordance with the above second embodiment, the interconnection layer and the contact plug are concurrently and unitary formed in a single deposition process and subsequent single chemical and mechanical polishing process. The number of the processes for fabrication is reduced. Since the interconnection layer and the contact plug are unitary formed, there is no problem with increase in the resistance at the connection portion between the interconnection and the buried plug nor problem with the disconnection between the interconnection and the buried plug. This also permits the semiconductor device to show high speed performances.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:
1. A method of forming a semiconductor device, comprising the steps of:
    forming an insulation film over a semiconductor substrate;
    providing a photo-resist pattern over said insulation film;
    carrying out an anisotropic etching to form a contact hole in said insulation film so that a part of said semiconductor substrate is shown through said contact hole;
    forming a base layer comprising first materials not only over a top surface of said insulation film but also on vertical side walls of said contact hole;
    in a single step depositing a conductive film, of a second material not including any of said first materials, in direct contact with and over said base layer so that said conductive film extends not only over said base layer extending over said insulation film but also within said contact hole, wherein said conductive film over said top surface of said insulation film has a first thickness which is thicker than a second thickness;
    subjecting a top surface of the conductive film to a chemical and mechanical polishing to planarize said top surface of sad conductive film so that the conductive film over said insulation film has said second thickness whereby an interconnection layer is unitarily formed with a conductive plug of said conductive film buried within said contact hole without any interface between said interconnection layer and said conductive plug; and
    patterning said conductive film over said insulation film to form at least an interconnection over said insulation film so that said interconnection is united with said conductive plug.

2. The method as claimed in claim 1, wherein said conductive film comprises a copper film deposited by a chemical vapor deposition method.

3. The method as claimed in claim 1, wherein said conductive film comprises an aluminum film deposited by a chemical vapor deposition method.

4. The method as claimed in claim 1, wherein said conductive film comprises a copper film deposited by a sputtering method.

5. The method as claimed in claim 1, wherein said conductive film comprises an aluminum film deposited by a sputtering method.

6. The method as claimed in claim 1, wherein said conductive film comprises a tungsten film deposited by a sputtering method.

7. The method as claimed in claim 1, wherein said chemical and mechanical polishing method is carried out using a slurry containing an oxidizing agent and alumina as abrasive powders.

8. The method as claimed in claim 1, wherein said chemical and mechanical polishing method is carried out using a slurry containing an oxidizing agent and silica as abrasive powders.

9. The method as claimed in claim 1, wherein said conductive film comprises a tungsten film deposited by a chemical vapor deposition method.

10. The method of claim 1 wherein said single step of depositing a conductive film is conducted at a temperature range of approximately 150° C. to 170° C.

* * * * *